(12) United States Patent
Oxley

(10) Patent No.: US 11,729,952 B2
(45) Date of Patent: Aug. 15, 2023

(54) SYSTEMS AND METHODS FOR REDUNDANT DATA CENTERS

(71) Applicant: Data Shelter, LLC, Ft. Pierce, FL (US)

(72) Inventor: Mark Edward Oxley, Pompano Beach, FL (US)

(73) Assignee: Data Shelter, LLC, Ft. Pierce, FL (US)

( * ) Notice: Subject to any disclaimer, the term of this patent is extended or adjusted under 35 U.S.C. 154(b) by 508 days.

(21) Appl. No.: 16/784,719

(22) Filed: Feb. 7, 2020

(65) Prior Publication Data

US 2020/0260616 A1    Aug. 13, 2020

Related U.S. Application Data

(60) Provisional application No. 62/802,426, filed on Feb. 7, 2019.

(51) Int. Cl.
*H02J 9/06* (2006.01)
*G05B 9/03* (2006.01)
*H05K 7/20* (2006.01)
*H05K 7/14* (2006.01)

(52) U.S. Cl.
CPC ........... *H05K 7/20745* (2013.01); *G05B 9/03* (2013.01); *H02J 9/06* (2013.01); *H05K 7/1497* (2013.01); *H05K 7/2079* (2013.01); *H05K 7/20827* (2013.01); *H05K 7/20836* (2013.01)

(58) Field of Classification Search
CPC ............. H05K 7/20745; H05K 7/1497; H05K 7/20836; H05K 7/2079; H05K 7/20827; G05B 9/03; H02J 9/06
See application file for complete search history.

(56) References Cited

U.S. PATENT DOCUMENTS

| | | |
|---|---|---|
| 6,465,909 B1 | 10/2002 | Soo et al. |
| 7,385,862 B2 | 6/2008 | Dubey |
| 7,459,803 B2 | 12/2008 | Mosman |
| 7,679,217 B2 | 3/2010 | Dishman |
| 7,681,404 B2 | 3/2010 | Bean, Jr. |
| 7,877,622 B2 | 1/2011 | Gruendler |
| 7,906,871 B2 | 3/2011 | Freeman et al. |
| 8,276,000 B2 | 9/2012 | Humphrey et al. |
| 8,423,806 B2 | 4/2013 | Cheng et al. |
| 8,644,997 B2 | 2/2014 | Lillis et al. |
| 8,671,287 B2 | 3/2014 | DeCusatis et al. |
| 8,688,413 B2 | 4/2014 | Healey et al. |
| 8,707,095 B2 | 4/2014 | Grimshaw |
| 8,907,520 B2 | 12/2014 | Chapel et al. |

(Continued)

FOREIGN PATENT DOCUMENTS

WO    WO2015148686 A1    10/2015

OTHER PUBLICATIONS

Fluegeman, Michael. 2(N+1) and 3N/2 Redundancy: High Reliability Optons. https://www.facilitiesnet.com/datacenters/article/2N1-and-3N2-Redundancy-High-Reliability-Options-Facilities-Management-Data-Centers-Feature--16763 Aug. 5, 2016.

(Continued)

*Primary Examiner* — Thomas C Lee
*Assistant Examiner* — Ameir Myers
(74) *Attorney, Agent, or Firm* — Carlton Fields, PA; Eleanor M. Yost

(57) ABSTRACT

This invention relates to systems and methods for redundant data center cooling and electrical systems.

3 Claims, 17 Drawing Sheets

(56) References Cited

U.S. PATENT DOCUMENTS

| | | |
|---|---|---|
| 8,949,081 B2 | 2/2015 | Healey |
| 9,192,069 B2 | 11/2015 | Emert et al. |
| 9,519,517 B2 | 12/2016 | Dalgas et al. |
| 9,552,053 B2 | 1/2017 | O'Connor et al. |
| 9,583,973 B2 | 2/2017 | Vogman |
| 9,698,589 B1 | 7/2017 | Leyh |
| 9,703,363 B2 | 7/2017 | Zhou |
| 9,778,717 B2 | 10/2017 | Kaplan |
| 9,846,467 B2 | 12/2017 | Gardner et al. |
| 9,904,331 B2 | 2/2018 | VanGilder et al. |
| 10,225,958 B1* | 3/2019 | Gao ............... H05K 7/20781 |
| 10,432,017 B1* | 10/2019 | Morales ............ H02J 7/0068 |
| 2007/0216229 A1 | 9/2007 | Johnson, Jr. et al. |
| 2010/0097044 A1 | 4/2010 | Gipson |
| 2010/0223085 A1* | 9/2010 | Gauthier ............ H05K 7/1492 |
| | | 709/200 |
| 2010/0300650 A1* | 12/2010 | Bean, Jr. ............ H05K 7/20745 |
| | | 165/104.31 |
| 2011/0016893 A1 | 1/2011 | Dawes |
| 2013/0046514 A1 | 2/2013 | Shrivastava et al. |
| 2013/0253716 A1 | 9/2013 | Gross et al. |
| 2015/0051749 A1 | 2/2015 | Hancock et al. |
| 2015/0121113 A1 | 4/2015 | Ramamurthy et al. |
| 2015/0249363 A1 | 9/2015 | Humphrey, Jr. et al. |
| 2017/0098956 A1 | 4/2017 | Sarti |
| 2017/0332510 A1 | 11/2017 | Sarti |
| 2018/0052431 A1 | 2/2018 | Shaikh et al. |
| 2020/0106297 A1* | 4/2020 | Ross ............... G05B 19/054 |

OTHER PUBLICATIONS

Allen, Mike. Redundancy: N+1, N+2 vs. 2N+1 (Part II). https://www.datacenters.com/news/redundancy-n1-n2-vs-2n-vs-2n1-part-ii Nov. 16, 2016.

McCarthy, et al. Comparing UPS System Design Configurations Jun. 14, 2018.

Piper, James, Understanding Types of UPS, https://www.facilitiesnet.com/powercommunication/article/Understanding-Types-of-UPS--13558 Oct. 12, 2012.

Piper, James; Emergency Power; The ABCs of UPS; https://www.facilitiesnet.com/powercommunication/article/Emergency-Power-The-ABCs-of-UPS--8596 Apr. 1, 2008.

* cited by examiner

SYSTEMS AND METHODS FOR REDUNDANT DATA CENTERS

CROSS-REFERENCE TO RELATED APPLICATIONS

This application claims priority from U.S. Provisional Patent Application Ser. No. 62/802,426, filed Feb. 7, 2019, which is incorporated herein by reference in its entirety.

FIELD OF THE INVENTION

This invention relates to systems and methods for redundant data center cooling and electrical systems.

BACKGROUND OF THE INVENTION

Even the best public utility systems are inadequate to meet the needs of mission-critical applications. Mission-critical facilities within various organizations require power that is not subject to loss or substantial variations. Variations in power across a system may result in data loss and component failure. Data centers, for example, consist of several components, and each may be a potential point of failure, which can incur significant financial and data losses. Such components may include power sources, backup generators, uninterruptible power supplies ("UPS"), power distribution units ("PDU"), and equipment power supplies (e.g., servers, routers, switches, etc.).

Many organizations, when faced with the likelihood of downtime and data processing errors caused by utility power choose to implement a UPS system between the public power distribution system and their mission-critical loads. The UPS system design configuration chosen for the application directly impacts the availability of the critical equipment it supports. There are many variables that affect a system's availability, including human error, reliability of components, maintenance schedules, and recovery time. The impact that each of these variables has on the overall system's availability is determined to a large degree, by the configuration chosen. Currently, several UPS solutions exist for supporting critical loads, including those systems known as "parallel redundant," "isolated redundant," "distributed redundant," "multiple parallel bus," "system plus system," and "isolated parallel," etc. (See McCarthy, et al. *Comparing UPS System Design Configurations*, available at: https://www.apc.com/salestools/SADE-5TPL8X/SADE-5TPL8X_R3_EN.pdf.)

Each type of UPS system configuration offers its own features and level of protection. Passive-standby systems, for example, are considered "off-line" systems and monitor incoming power and switch to a battery source when an interruption occurs. This transfer takes place in milliseconds and is acceptable for some applications. But the loss of power during the transfer can disrupt the operation of sensitive electronic equipment. These UPS also do not filter power-line noise or voltage spikes or sags. Because of these limitations, their use is limited largely to systems not performing critical tasks.

Line-interactive UPS systems, in contrast, include a transformer or an inductor between the power source and the connected equipment. Such systems further include a bank of batteries to condition and filter incoming power. These types of systems offer more protection than passive-standby configurations, but do not completely isolate the protected equipment from irregularities in the incoming power. These systems offer adequate protection for many facility applications, but not enough protection for mission-critical operations, such as data centers.

Double-conversion systems, however, eliminate the momentary loss of power found in the other two types of UPS in the transfer from incoming power to battery-supplied power by using a bank of batteries connected to the direct-current part of the system. These UPS fully isolate protected equipment from the power source, thereby eliminating most power disturbances.

Such UPS system topologies can become quite complex. For example, "distributed redundant" configurations, also known as tri-redundant, are commonly used in the large data center market, sometimes within financial organizations. The basis of this design uses three or more UPS modules with independent input and output feeders. The independent output buses are connected to the critical load via multiple PDUs.

"System plus system" configurations are often located in standalone, specially-designed buildings. It is not uncommon for the infrastructure support spaces (UPS, battery, cooling, generator, utility, and electrical distribution rooms) to be equal in size to the data center equipment space, or even larger.

From the utility service entrance to the UPS, a distributed redundant design and a system plus system design may be similar. Both provide for concurrent maintenance, and minimize single points of failure. The major difference is in the quantity of UPS modules that are required in order to provide redundant power paths to the critical load, and the organization of the distribution from the UPS to the critical load. As the load requirement, "N", grows, the savings in quantity of UPS modules also increases.

Choosing a traditional UPS system to protect facilities and systems may be difficult, such system must be sized properly for the load it is designated to protect. Managers also need to properly size the batteries in the UPS to provide the desired runtime in the event of a power loss. For some applications, the UPS only needs to provide power long enough to allow an orderly shutdown of connected equipment. But in other applications, the batteries will need enough capacity to provide power for the duration of common power interruptions. The required battery capacity will depend on the nature of the functions performed by the protected load. But there is a need in the art to increase the reliability of these critical power components by implementing redundancy, in order to provide a high-availability environment.

Redundancy refers to a system design where a component is duplicated so that in the event of a component failure, IT equipment is not impacted. The main goal of redundancy is to ensure zero downtime. Active redundancy eliminates performance declines by monitoring the performance of individual devices, and this monitoring is used in voting logic. The voting logic is linked to switching that automatically reconfigures the components. Electrical power distribution provides an example of active redundancy.

Cooling is also a major cost factor in data centers. If cooling is implemented poorly, the power required to cool a data center can match or exceed the power used to run the IT equipment itself. Cooling also is often the limiting factor in data center capacity. In some cases, heat removal can be a bigger problem than getting power to the equipment.

SUMMARY OF THE INVENTION

In one form, the system of the invention comprises a data center system comprising at least three independent, shared-airspace cooling system modules, and at least three, fully-compartmentalized electrical or power system modules, in which the load is preferably spread near-evenly through the systems, and in which a failure or maintenance of any one of the cooling or electrical/power modules does not impact the critical load.

On the whole, the system will preferably maintain at least 51% utilization efficiency of capacity at full 100% critical load under normal operating conditions.

Some embodiments of the invention are not computer-controlled, but mechanically-controlled, so that hacking or failure of controller software is not potential a point of failure. And within the system, communication occurs only within subsystems, not between subsystems.

BRIEF DESCRIPTION OF THE DRAWINGS

The invention is disclosed with reference to the accompanying drawings, wherein.

Corresponding reference characters indicate corresponding parts throughout the several views. The example(s) set out herein illustrate several embodiments of the invention but should not be construed as limiting the scope of the invention in any manner.

DETAILED DESCRIPTION

Figure 1:
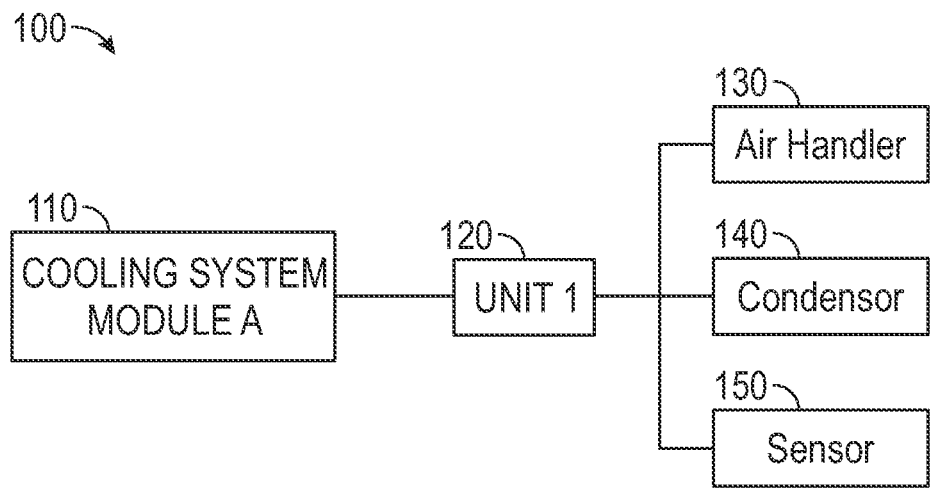
FIG. 1 is a schematic view of a cooling system module according to one embodiment of the invention.

Referring now to FIG. 1, there is shown an embodiment of a cooling system module 110 of a data center system 100. Cooling system module 110 comprises groups of equipment. The method of cooling that is delivered into the data center system 100 is refrigerant-based. Each cooling system module 110 comprises one or more cooling units 120, which each comprise an air handler/blower 130 (including related components), condenser or refrigerant distribution system 140, and thermal sensor 150. Each cooling unit 120 may contain additional auxiliary systems. For example, as shown in FIG. 1, cooling system module 110 A is shown as comprising "Unit 1," cooling unit 120, which in turn comprises air handler 130, condenser 140, and temperature sensor 150. Cooling system module 110 A may further comprise additional auxiliary components.

Figure 2:
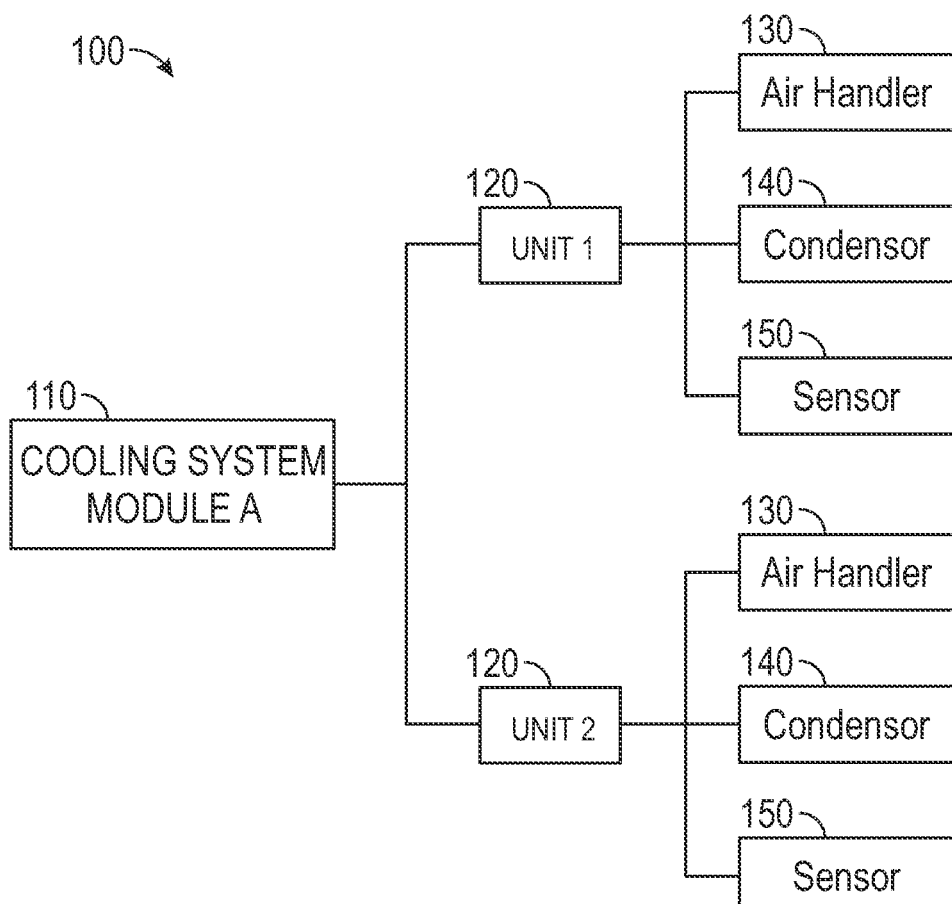
FIG. 2 is a schematic view of a cooling system module according to one embodiment of the invention.

Turning to FIG. 2, cooling system module 110 A may alternatively comprise several or multiple cooling units 120 (e.g., "Unit 1" and "Unit 2"). Preferably, each of the cooling system modules 110 comprises at least three cooling units 120.

Figure 3:
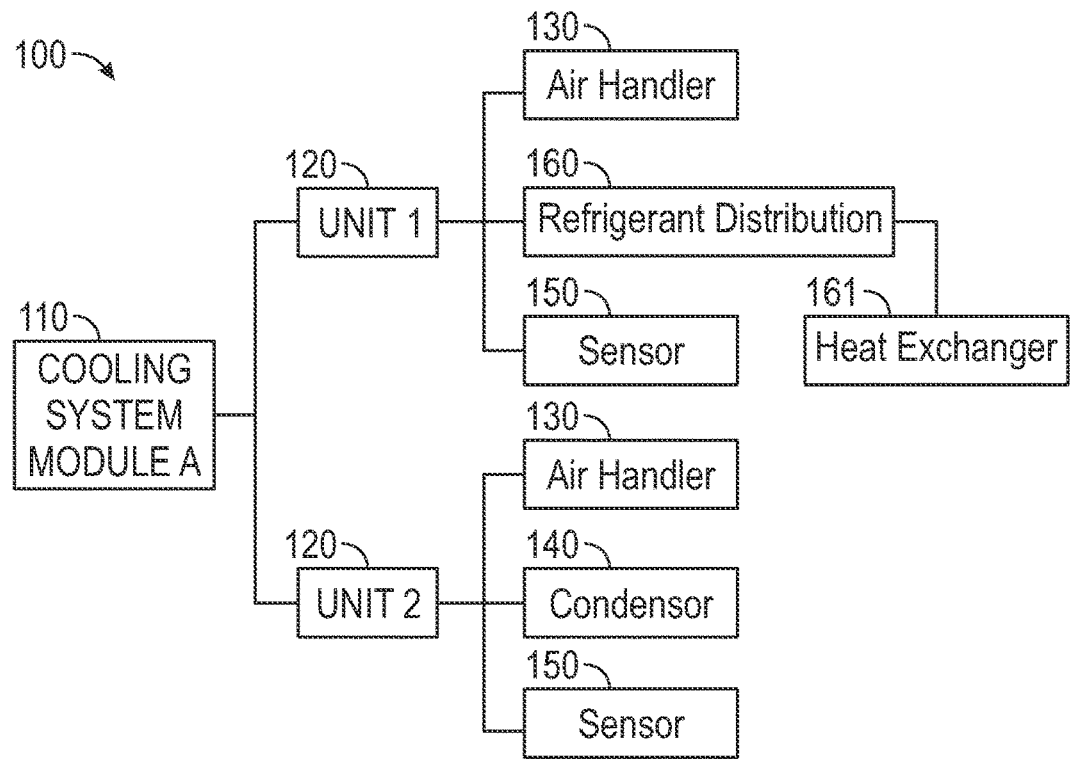
FIG. 3 is a schematic view of a cooling system module according to one embodiment of the invention.

Turning to FIG. 3, each cooling system module 110 may further alternatively comprise refrigerant distribution modules 160 and external cooling loops (see, e.g., FIG. 8) and heat exchangers 161, e.g., infra-red heat exchangers 162, chillers, or hybrid cooling solutions.

Figure 4:
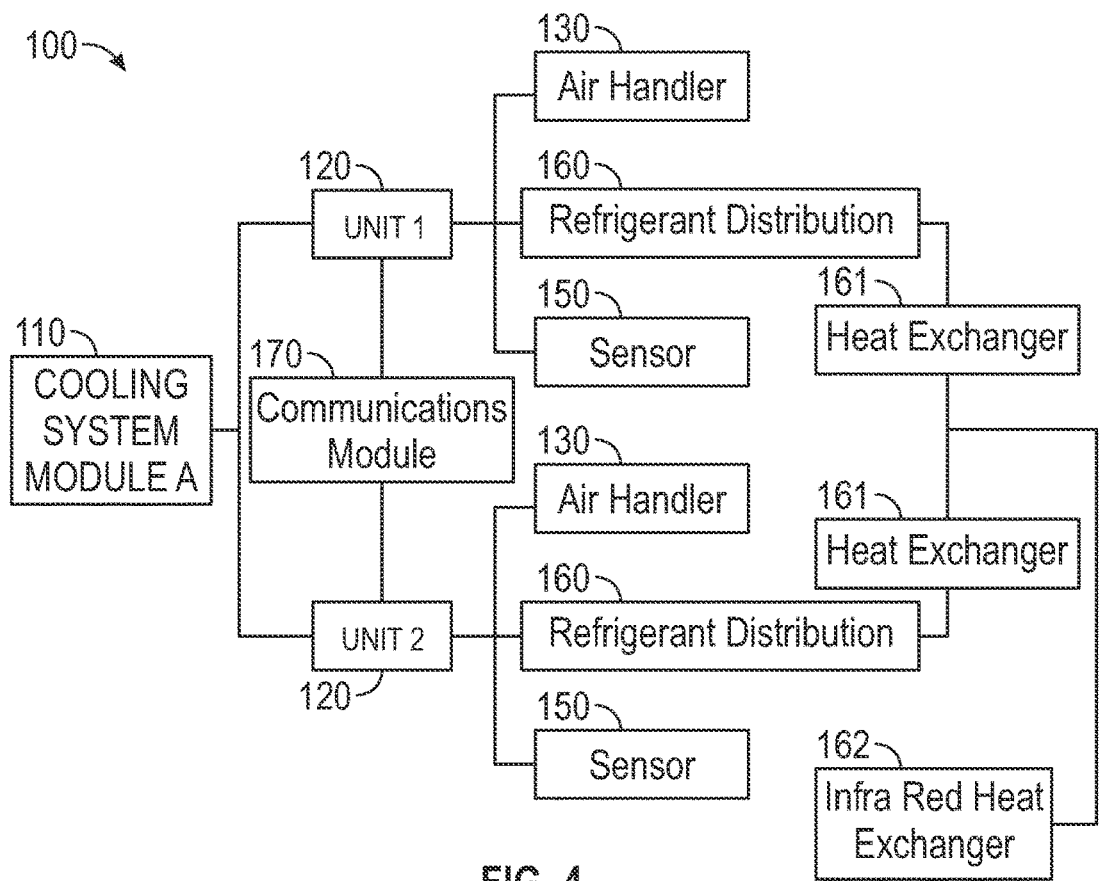
FIG. 4 is a schematic view of a cooling system module according to one embodiment of the invention.

Turning to FIG. 4, cooling system module 110 A may further comprise communications module 170 for communicating data wired or wirelessly between cooling units 120 Unit 1 and Unit 2.

Each cooling system module 110 preferably runs an average of no less than 51% of the critical load of the overall data center system 100 under full normal operation when the load is near balance, and upon failure or maintenance, each cooling system module 110 will independently increase cooling, based on environmental inputs, to assume the critical load within ASHRAE Thermal Guidelines For Data Processing TC9.9 3rd Edition.

In one embodiment, there is no electronic communication between each cooling system module 110, though communication (wired or wireless, including software-mediated communication) within a module (e.g., between or among cooling units 120) may occur, such as shown in FIG. 4.

Figure 5:
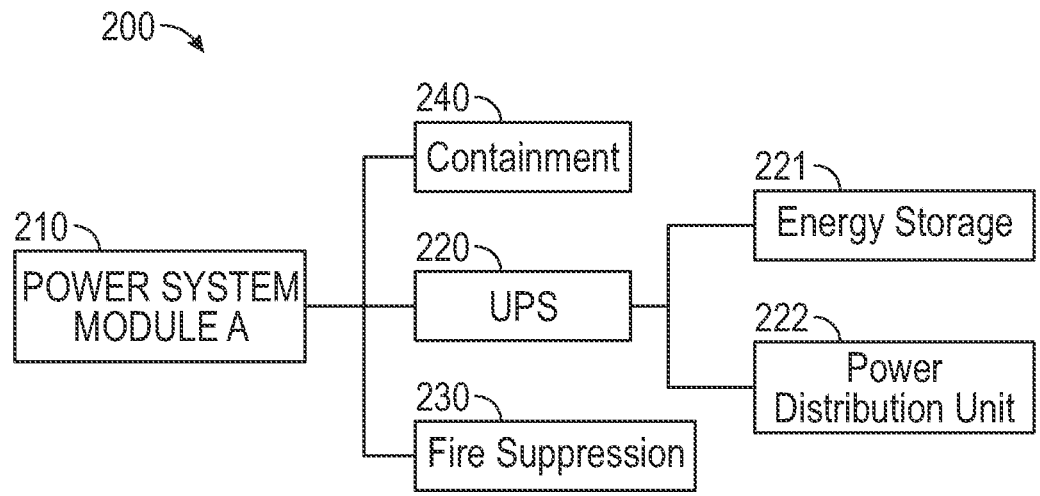
FIG. 5 is a schematic view of a power system module according to one embodiment of the invention.

Turning to FIG. 5, exemplary power system modules of data center system 200 is shown comprising compartmentalized electrical modules 210 and pathways (referred to in the figures and herein as power system modules 210), with each power system module 210 preferably individually utilizing at minimum 51% of its capacity when the critical load is at 100% and the load is near balance. The critical load may be divided near equally among each electrical module and pathway.

Each power system module 210 and pathway is fully compartmentalized from each other until the point of demarcation. Compartmentalization requires a minimum level of dust, smoke, and splash resistance meeting NEMA TYPE 3; thirty (30) minutes of fire rating when tested to ASTM E814/UL 1479; and mostly non-shared airspace under normal operating conditions (sealed, but not necessarily hermetically sealed, from one another).

When one power system module 210 fails or is taken offline for maintenance, the remaining power system modules 210 automatically assume the deficit, maintaining the critical load without fault through an active-active (rather than active-passive) design. As a whole, the electrical design will preferably maintain at least 51% efficiency of total capacity at full 100% critical load under normal operating conditions. All power system modules 210 preferably run in active-active state under normal operating conditions.

As shown in FIG. 5, each power system module 210 preferably comprises UPS 220 with energy storage 221 (e.g., chemical battery, capacitor, mechanical centrifugal battery, gravity battery), power distribution unit ("PDU") 222, independent HVAC cooling system, fire suppression/prevention system 230, and containment 240 to provide compartmentalization in any combination, and may contain additional auxiliary systems.

Figure 6:
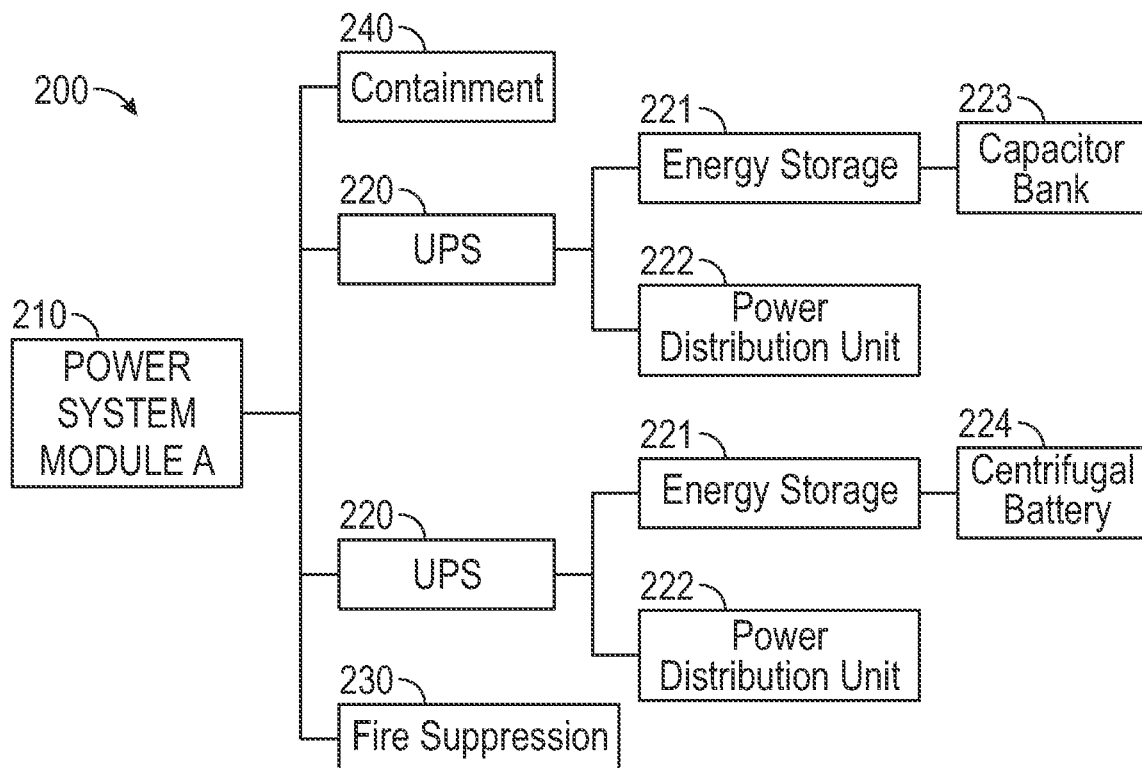
FIG. 6 is a schematic view of a power system module according to one embodiment of the invention.

Turning to FIG. 6, each power system module 210 may optionally include more than one UPS 220, each with its own energy storage 221, PDU 222, and other auxiliary components such as capacitor banks 223 or centrifugal batteries 224. The components within UPS 220 subsystems within each power system module 210 (or across power system modules) need not be identical.

Figure 7:
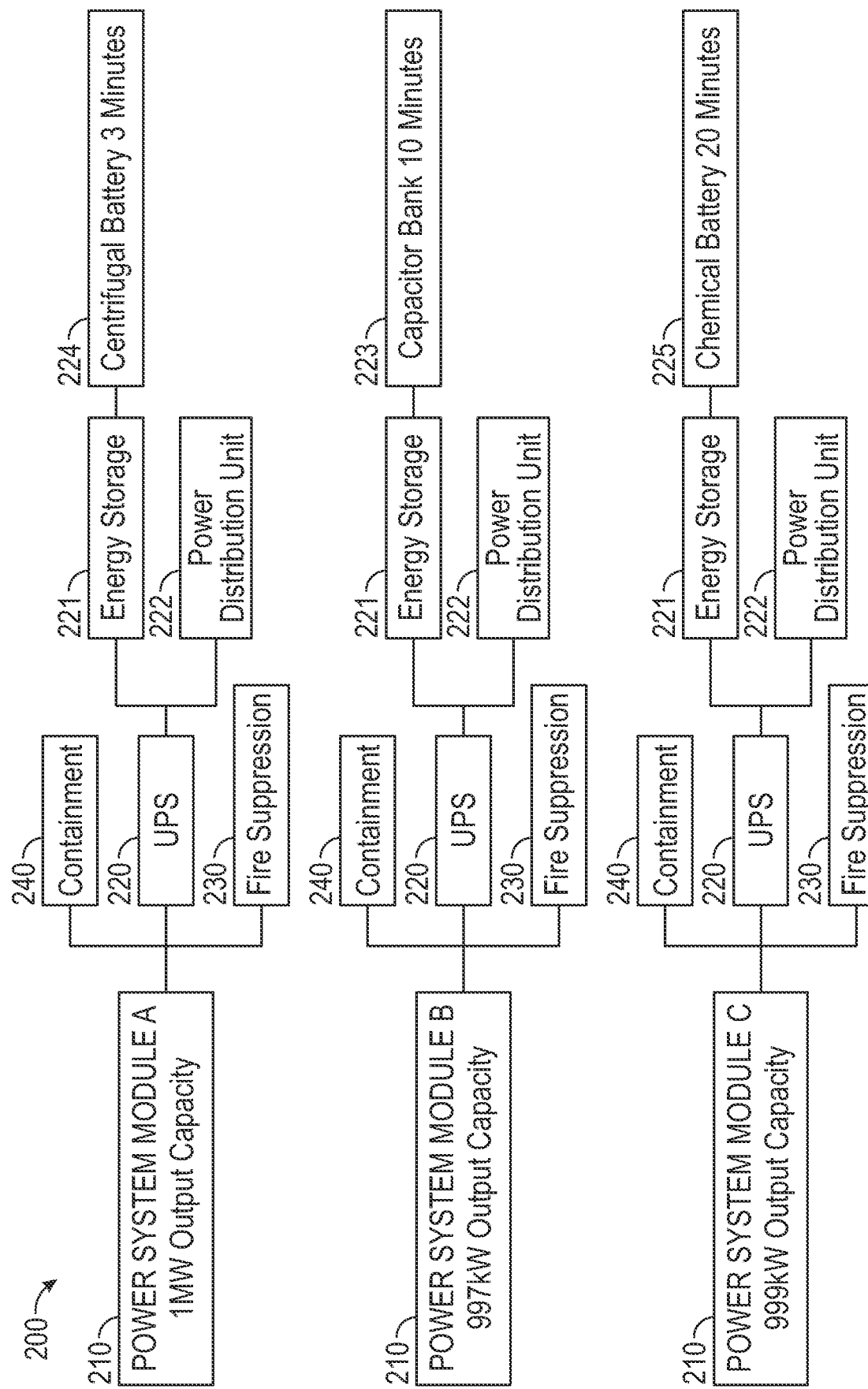
FIG. 7 is a schematic view of a plurality of power system modules and paired cooling system modules according to one embodiment of the invention.

Turning to FIG. 7, power system modules 210 within a given data center system need not have identical power outputs, as shown. In this embodiment, three power system modules 210 are provided, each comprising at least one UPS 220 subsystem, containment 240 to provide compartmentalization, and fire suppression 230 subsystem. Each UPS 220 subsystem comprises at least one energy storage 221 and at least one PDU 222.

Power system module 210 A, as shown in FIG. 7, has a 1 megawatt output capacity and comprises centrifugal battery 224 (with three minute charge) within its UPS 220 subsystem. Power system module 210 B, on other hand, has a 997 kilowatt output capacity, and comprises capacitor bank 223 (with ten minute charge) within its UPS 220 subsystem. Power system module 210 C has a 999 kilowatt output capacity, and comprises chemical battery 225 (with twenty minute charge) with its UPS 220 subsystem.

Each power system module 210 may be optionally fed by multiple power sources (utility, generator, renewable and alternative energy) but one of each source must be fully-independent to each power system module 210. Each power system module 210 may have non-equal energy storage capacity (runtime) and equipment types (when compared to other power system modules 210 in the system), so long as total output wattage of each power system module 210 within a given system is near equal, as shown with power system modules 210 A, B, and C.

Figure 8:
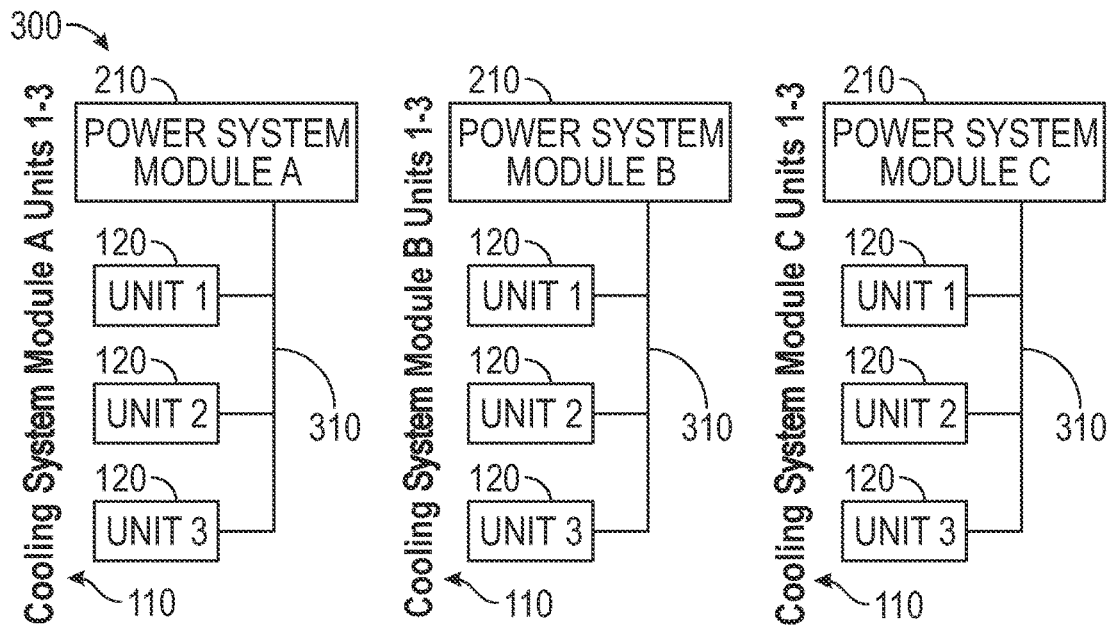
FIG. 8 is a schematic view of a plurality of power system modules and paired cooling system modules according to one embodiment of the invention.

In an embodiment of data center system 300 of the invention shown in FIG. 8, no less than three cooling system modules 110 A, B, and C are provided. Each cooling system module 110 comprises cooling unit(s) 120 1, 2, and 3 (as shown, each cooling system module 110 comprises three cooling units 120). Each cooling unit 120 further comprises one or more refrigerant-based air handlers, preferably located inside a data center processing space.

Cooling system modules 110 A, B, and C, as shown, do not communicate with one another via data-based (e.g., software-based or networked) communications, though they may communicate internally (i.e., within a module, from cooling unit 120-to-unit 120) via wire or wireless data-based communication system 310.

Each cooling system module 110 uses a thermal temperature input to monitor and ultimately adjust the temperature as needed (as may be known to those of skill in the art) to maintain the load across data center system 300.

Each cooling system module 110 A, B, and C is paired to a corresponding power system module 210, identified as power system modules 210 A, B, and C, such that for each power system module 210, there is one paired cooling system module 110.

The electrical system is composed of a minimum of three (3) compartmentalized power system modules 210 and pathways (identified as power system modules 210 A, B, and C) with each power system module 210 preferably individually utilizing at minimum 51% of its capacity when the critical load is at 100%.

In some embodiments, the critical load may be preferably divided near-equally among each power system module 210 and pathway. Each power system module 210 is compartmentalized from each other, and each pathway is compartmentalized until its point of demarcation.

In some embodiments, when one power system module 210 fails or is taken offline for maintenance, the remaining power system modules 210 automatically assume the deficit, maintaining the critical load without fault.

Figure 9:
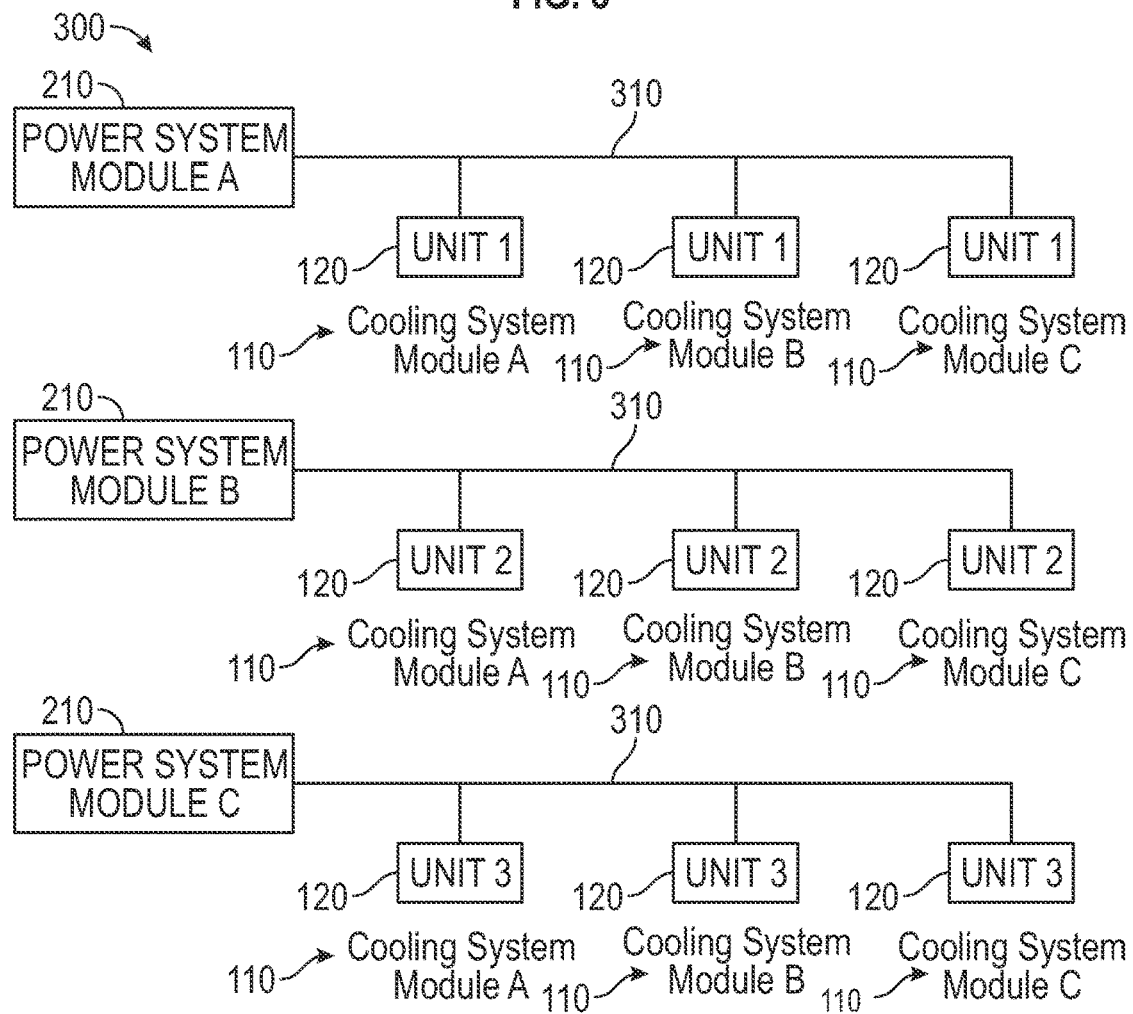
FIG. 9 is a schematic view of a plurality of power system modules and paired cooling system modules according to one embodiment of the invention.

In another embodiment, shown in FIG. 9, several cooling system modules 110 are provided (identified as cooling system modules 110 A, B, and C), each comprising three cooling units 120 (identified as cooling units 120 1, 2, and 3). These cooling system modules 110 and cooling units 120 have the same features as described above, however in this embodiment, each cooling system module 110 is paired (1:MANY) to all three of the power system modules 210. In other words, each power system module 210 A, B, and C will supply a portion of the power required by each cooling system module 110 A, B, and C. For example, as shown in FIG. 9, power system module 210 A supplies the power required by each "Unit 1" of each of cooling system modules 110 A, B, and C; power system module 210 B supplies the power for each "Unit 2" of cooling system modules 110 A, B, and C; and power system module 210 C supplies the power for each "Unit 3" of cooling system modules 110 A, B, and C.

In a further embodiment, a data center system is provided that comprises no less than three (3) independent shared-airspace cooling system modules 110, and no less than four (4) fully-compartmentalized power system modules 210, in which the load is preferably spread near-evenly through the system, and in which a failure or maintenance of any one cooling system module 110 or power system module 210 does not impact the critical load.

Figure 10:
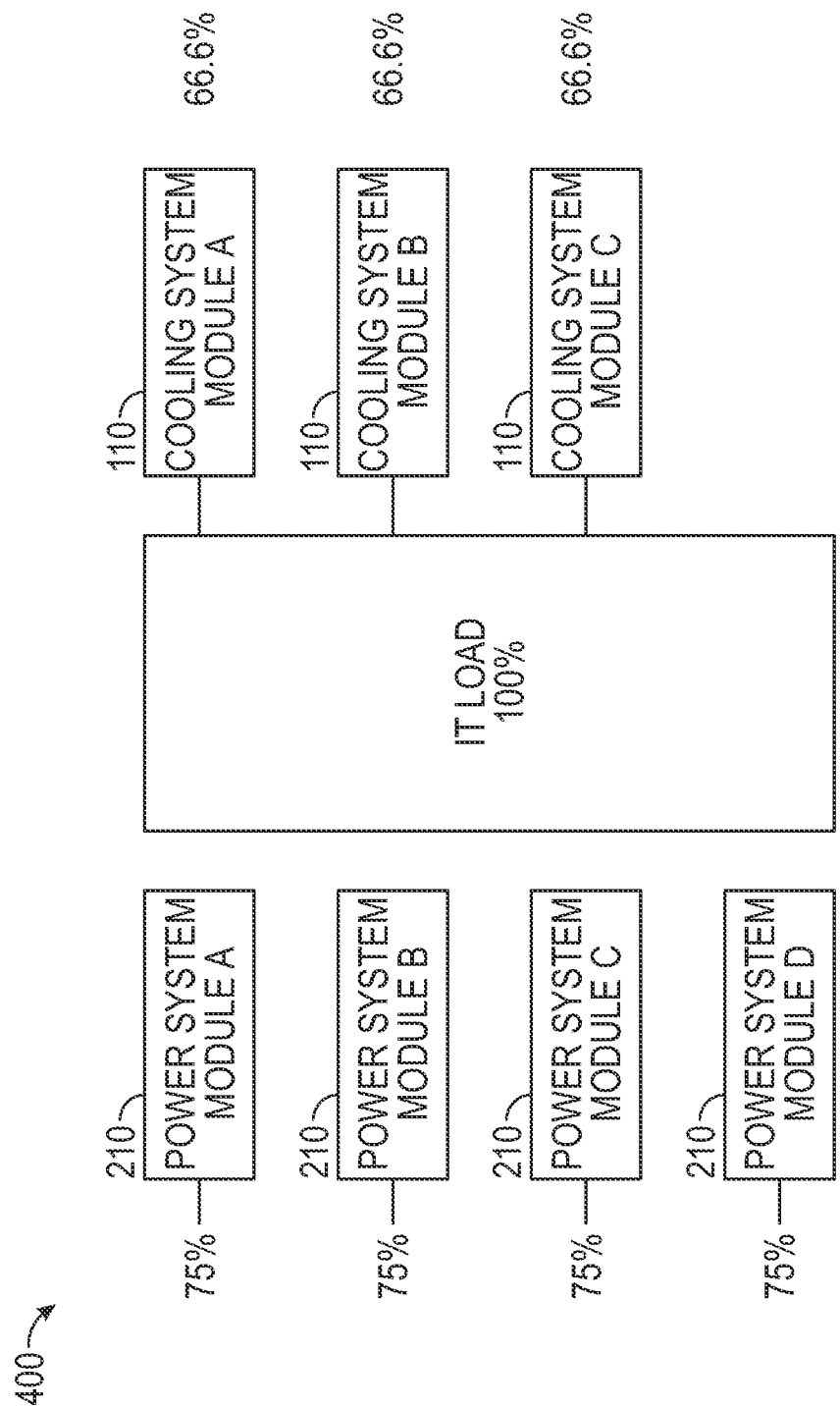
FIG. 10 is a schematic view of an exemplary load distribution across power system modules under normal operating conditions according to one embodiment of the invention.

Turning to FIG. 10, another example of data center system 400 is shown where a data center IT load is 100%. The data center system's 400 power is supplied by four power system modules 210 A, B, C, and D, and cooling needs are met by three cooling system modules 110 A, B, and C.

Under normal operating conditions, each of the four power system modules 210 is preferably operated at least 51% utilization, and in this example, at least 75% utilization. Each of the cooling system modules 110 is preferably operated at 66.6% utilization and in no event less than 51% utilization. All of the power system modules 210 and cooling system modules 110 are active under normal operating conditions, i.e., none are in "stand-by" mode.

Figure 11:
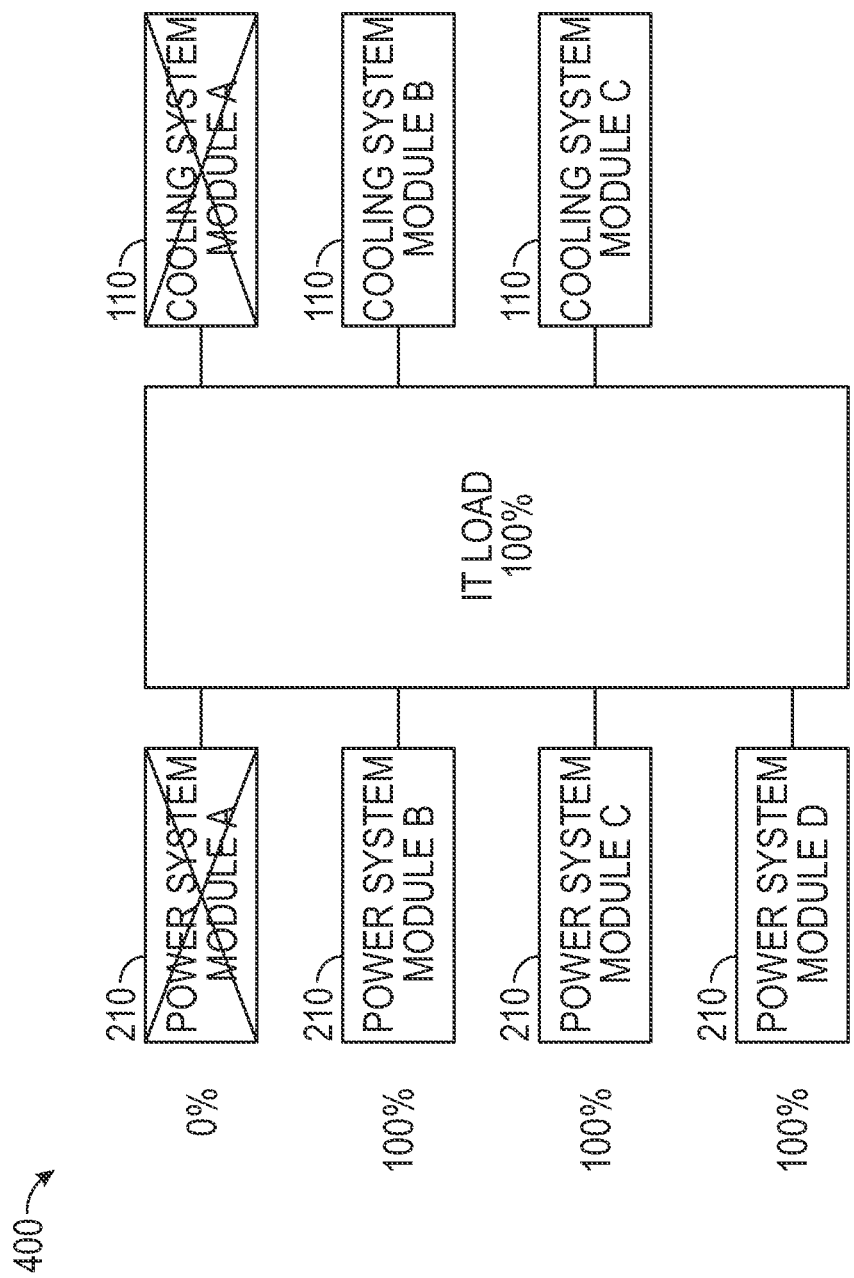
FIG. 11 is a schematic view of an exemplary load distribution across power system modules under fault conditions according to one embodiment of the invention.

This configuration allows for one of each of the power system modules 210 (A, B, C, or D) and cooling system modules 110 (A, B, or C) to be removed from the data center system 400 (due to fault, maintenance, etc.), while still maintaining 100% of the critical IT load, as shown in FIG. 11, where power system module 210 A and cooling system module 110 A are both taken offline. The 75% utilization of power system module 210 A is then compensated for by power system modules 210 B, C, and D, which operate at 100% utilization when power system module 210 A is taken or goes offline. Similarly, the 66% utilization of cooling system module 110 A is compensated for by splitting the utilization between cooling system modules 110 B and C, which operate at 100% when cooling system module 110 A is taken or goes offline. The total IT load of 100% remains unaffected by the loss power system module 210 A and cooling system module 110 A.

Figure 12:
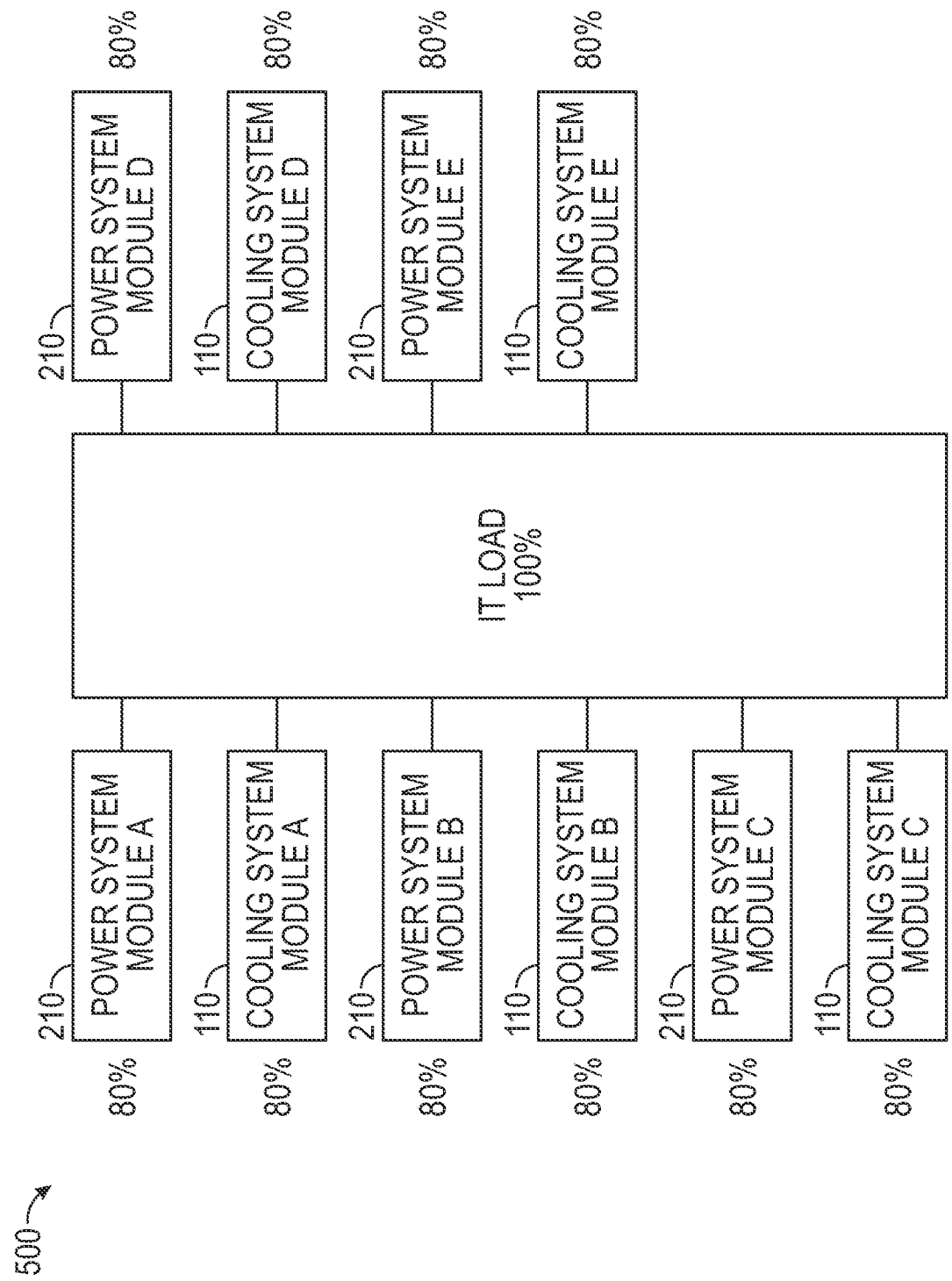
FIG. 12 is a schematic view of an exemplary load distribution across power system modules and cooling system modules under normal operating conditions according to one embodiment of the invention.

In an alternative embodiment, data center system 500 shown in FIG. 12, where five pairs of 1:1 paired power system modules 210 and cooling system modules 110 (Pair A, B, C, D, and E) are provided. Each module is operated at 80% utilization to maintain 100% of the critical IT load.

Figure 13:
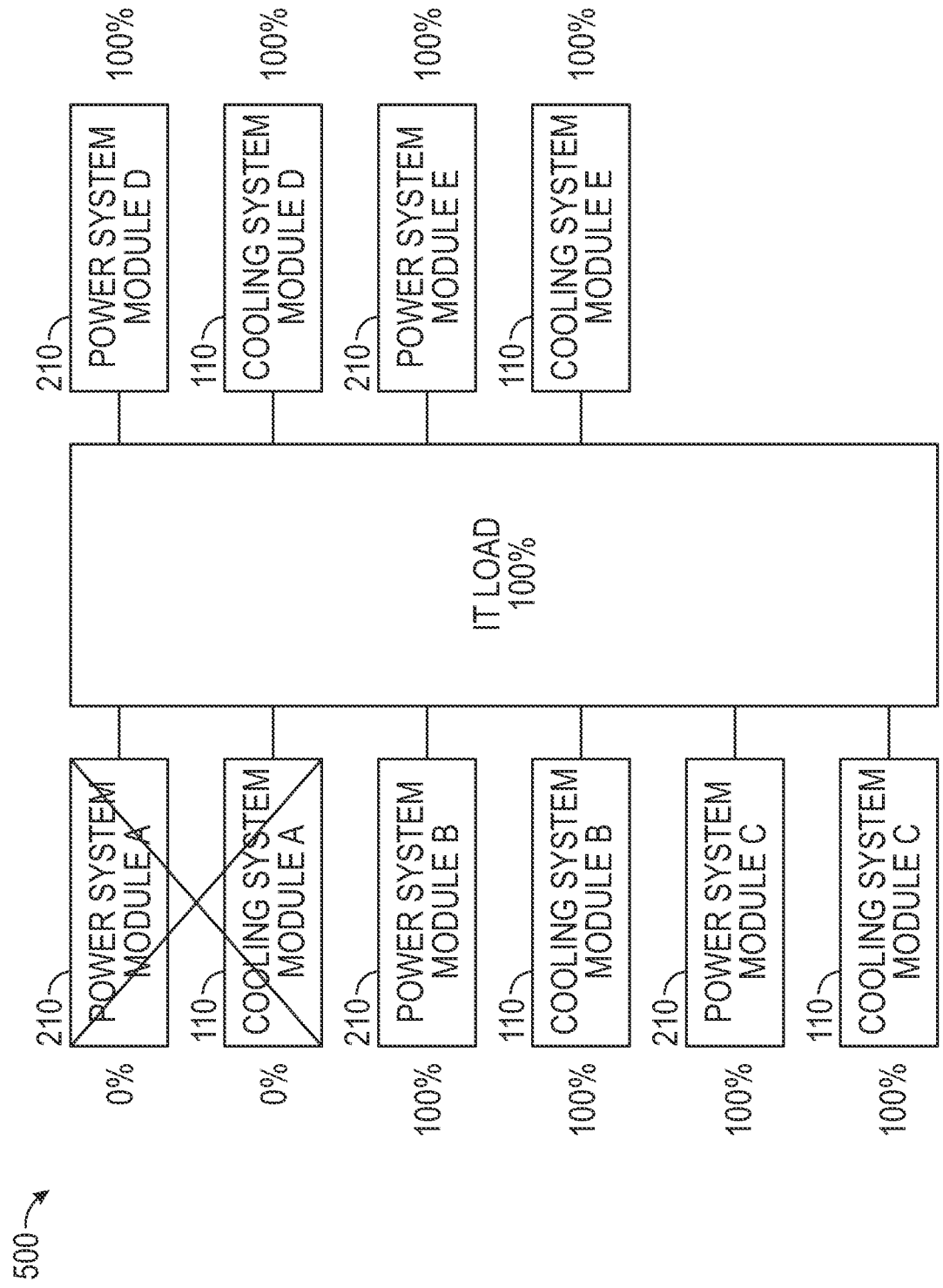
FIG. 13 is a schematic view of an exemplary load distribution across power system modules and cooling system modules under fault conditions according to one embodiment of the invention.

This configuration allows for one pair of the power system modules 210 and cooling system modules 110 (A, B, C, D, or E) to be removed from the system (due to fault, maintenance, etc.), while still maintaining 100% of the critical IT load, as shown in FIG. 13, where pair power system module 210 A and cooling system module 110 A are both taken offline. The 80% utilization of each of power system module 210 A and cooling system module 110 A is then compensated for by the four other pairs of power system modules 210 and cooling system modules 110 B, C, D, and E, which operate at 100% utilization when pair of power system module 210 A and cooling system module 110 A is taken or goes offline. The total IT load of 100% remains unaffected by the loss of the pair of power system module 210 A and cooling system module 110 A.

Figure 14:
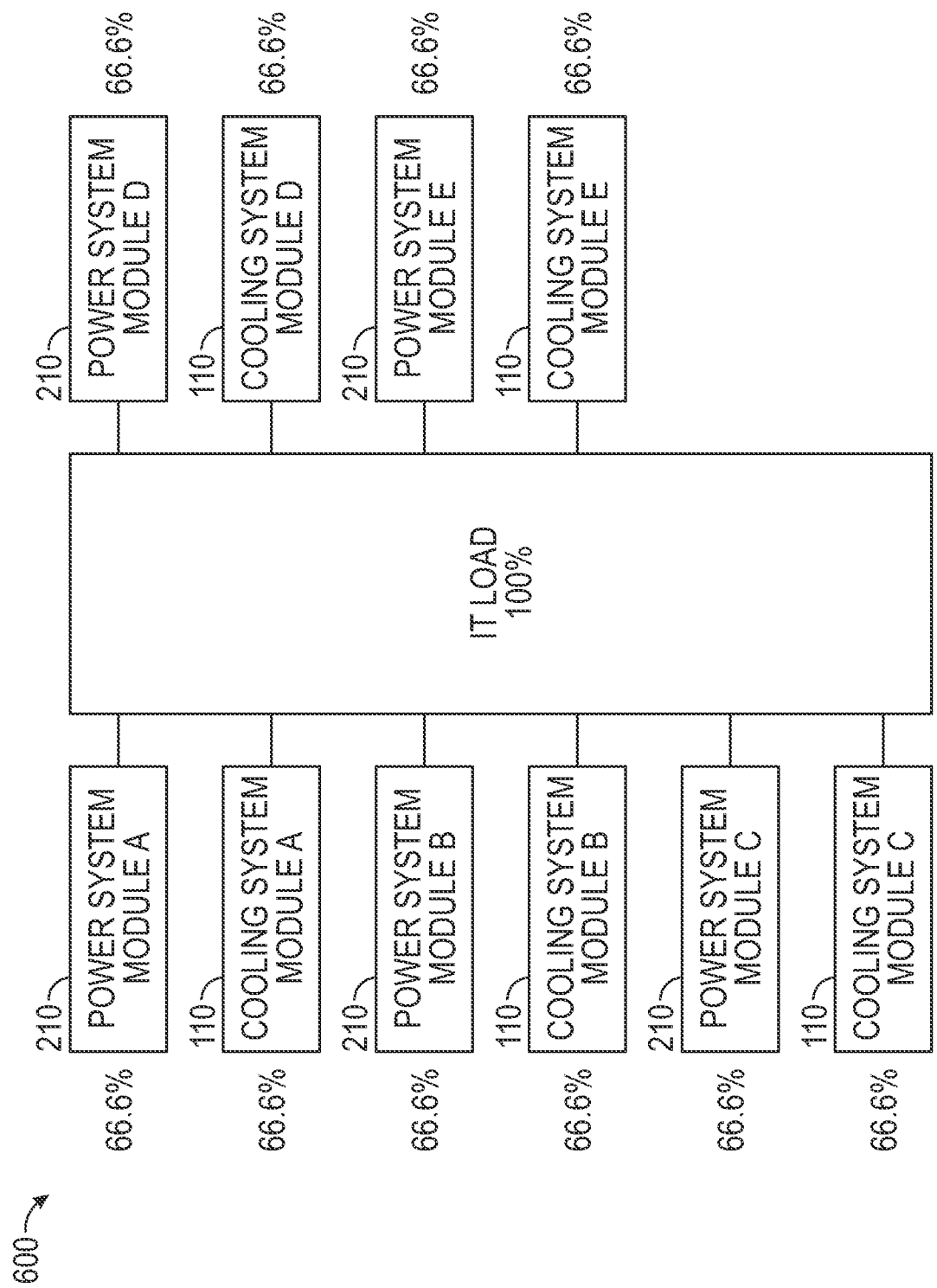
FIG. 14 is a schematic view of an exemplary load distribution across power system modules and cooling system modules under normal operating conditions according to one embodiment of the invention.

In an alternative embodiment, data center system 600 shown in FIG. 14, where five pairs of 1:1 paired power system modules 210 and cooling system modules 110 (Pair A, B, C, D, and E) are provided. Each module is preferably operated at 66.6% utilization to maintain 100% of the critical IT load.

Figure 15:
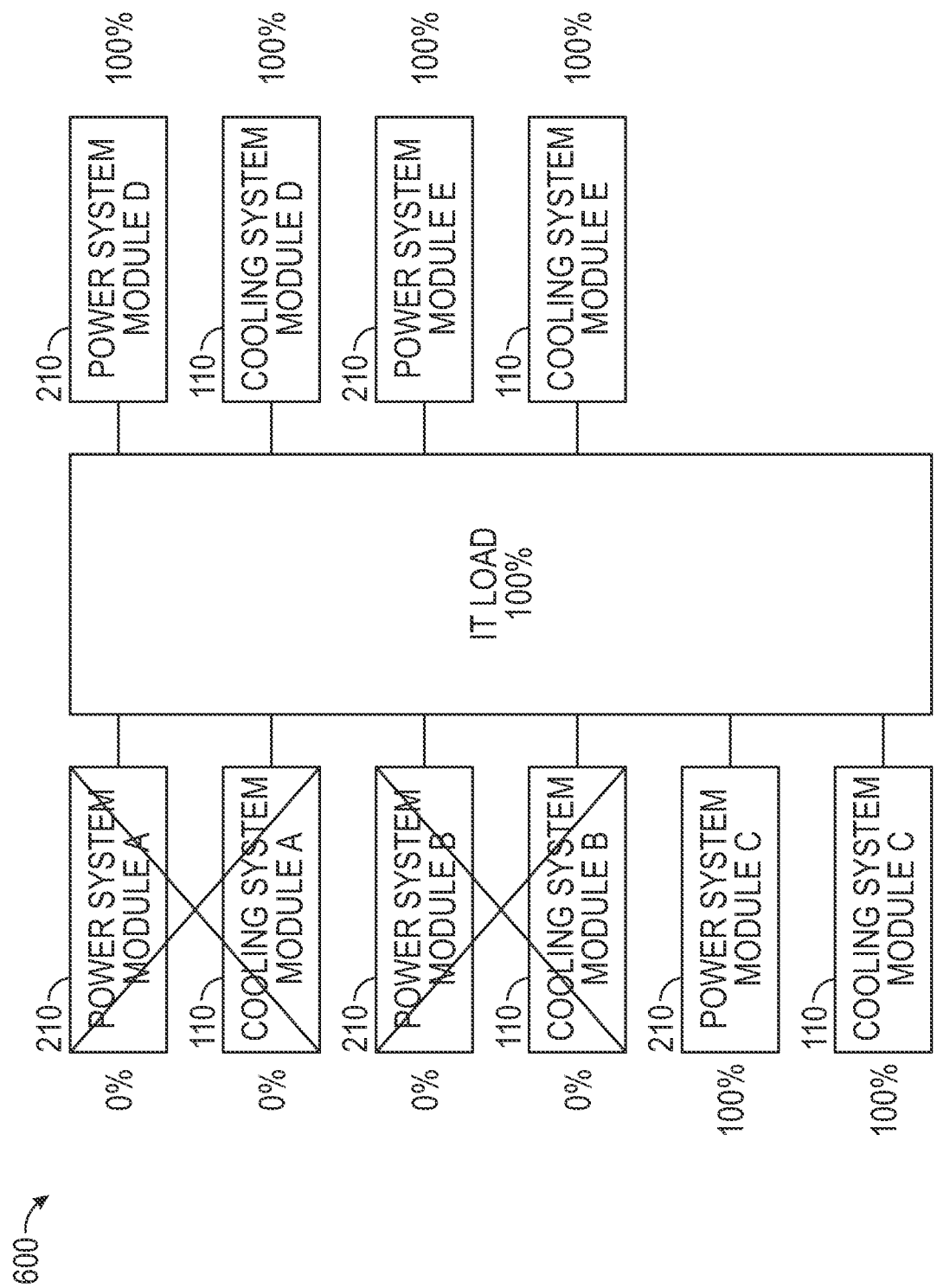
FIG. 15 is a schematic view of an exemplary load distribution across power system modules and cooling system modules under fault conditions according to one embodiment of the invention.

This configuration allows for two pairs of the power system modules 210 and cooling system modules 110 (A, B, C, D, or E) to be removed from the data center system 600 (due to fault, maintenance, etc.), while still maintaining 100% of the critical IT load, as shown in FIG. 15, where pair power system module 210 A and cooling system module 110 A are offline, and pair power system module 210 B and cooling system module 110 B are also offline. The 66.6% utilization of each of two pairs of power system modules 210 and cooling system modules 110 A and B is then compensated for by the three other pairs of power system modules 210 and cooling system modules 110 C, D, and E, which operate at 100% utilization. The total IT load of 100% remains unaffected by the loss of the two pairs of power system modules 210 and cooling system modules 110 A and B.

The total load that can be carried by a power system module 210 depends in part on the rating of the facility's input. If the actual load exceeds the rating on the input for a sufficient period of time, the input breaker will trip, and power will be interrupted to everything that receives power from that input. To design a data center system where power is not interrupted, the load for the equipment (e.g., "IT Load") must be estimated by some means. There are various ways known in the art to estimate the power of an IT equipment deployment in a data center (e.g. faceplate rating, direct power measurement). The approach chosen depends on the goal of the end user. The actual power consumption for a server, for example, depends on many factors. First, and most obviously, server power depends heavily on the configuration. Even for similarly configured hardware, power consumption can vary from system to system. In view of the potential variability, any general power number that is used for capacity budgeting should be conservative. The consequence of under-provisioning power is increased downtime risk.

Turning now to FIGS. 16-19, an example of a data center system 700 according to an embodiment of the invention is shown.

Figure 16:
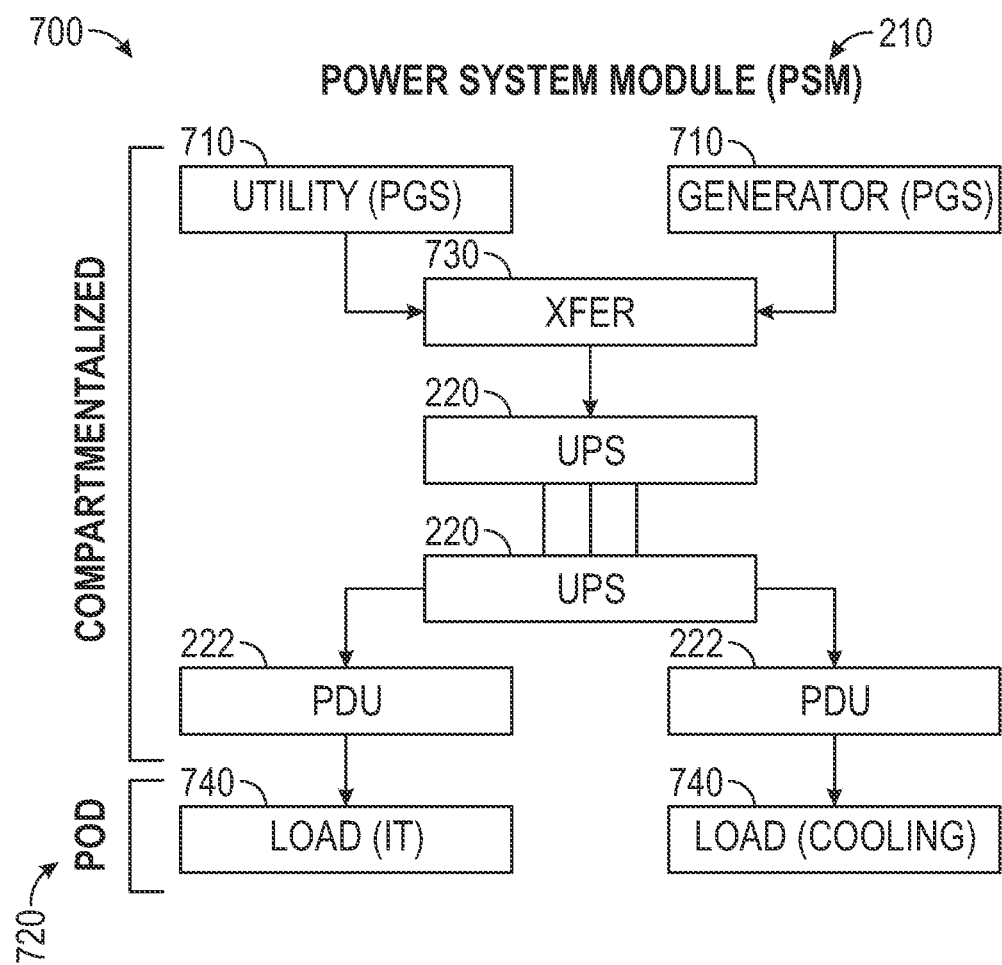
FIG. 16 is a diagram of a power system module according to one embodiment of the invention.

In FIG. 16, power system module 210 (identified as PSM) comprises several pieces of power generation, storage, and/or distribution equipment. Each sub-system is running to provide power downstream from power generation source (PGS) 710 to the load. In this example, power generation source 710 is a generator.

In data center system 700, each power system module 210 is separately contained and compartmentalized from other power system modules 210 until the power reaches a point of demarcation/distribution (POD) 720, for example, in a data center processing space, so the load is protected from a single fault or failure in one power system module 210.

Each power system module 210 is fed power by power generation sources 710 running in parallel in an active/passive state. In the example shown in FIG. 16, power system module 210 comprises a utility power generation source 710 (active state) and a generator power generation source 710 (passive state). The generator may be any suitable generator, for example, a Kohler KD Series Generator or the like. Each power generation source 710 in the power system module 210 is connected to transfer switch (XFR) 730 to switch between power generation sources 710 in the event of a loss of utility power, maintenance, or the like.

In this example, downstream of transfer switch 730 are multiple parallel connected uninterruptable power supply (UPS) 220 units. In one embodiment, the UPS 220 units are APC Symmetra MW UPS units. UPS 220 units are configured to provide reliable power to the load when transfer switch 730 transfers between power generation sources (PGS) 710. The UPS 220 units are connected downstream to power distribution units (PDUs) 222. The PDUs 222 are configured to distribute power to the load 740.

In this example, load 740 represents any need for uninterrupted critical power, e.g., information technology (servers), cooling, or infrastructure. Load 740 is preferably near-equally balanced between each power system module 210 as an operational requirement under normal operating conditions. In this example, each power system module 210 maintains a maximum aggregate average below 75% of the rated load capacity for available utilization under normal load conditions. Should power system module 210 have a fault or failure or need to be taken offline for maintenance (FFM), the net result will increase to a maximum aggregate average below 100% of the rated load capacity for available utilization under FFM load conditions across the remaining operational units.

Figure 17:
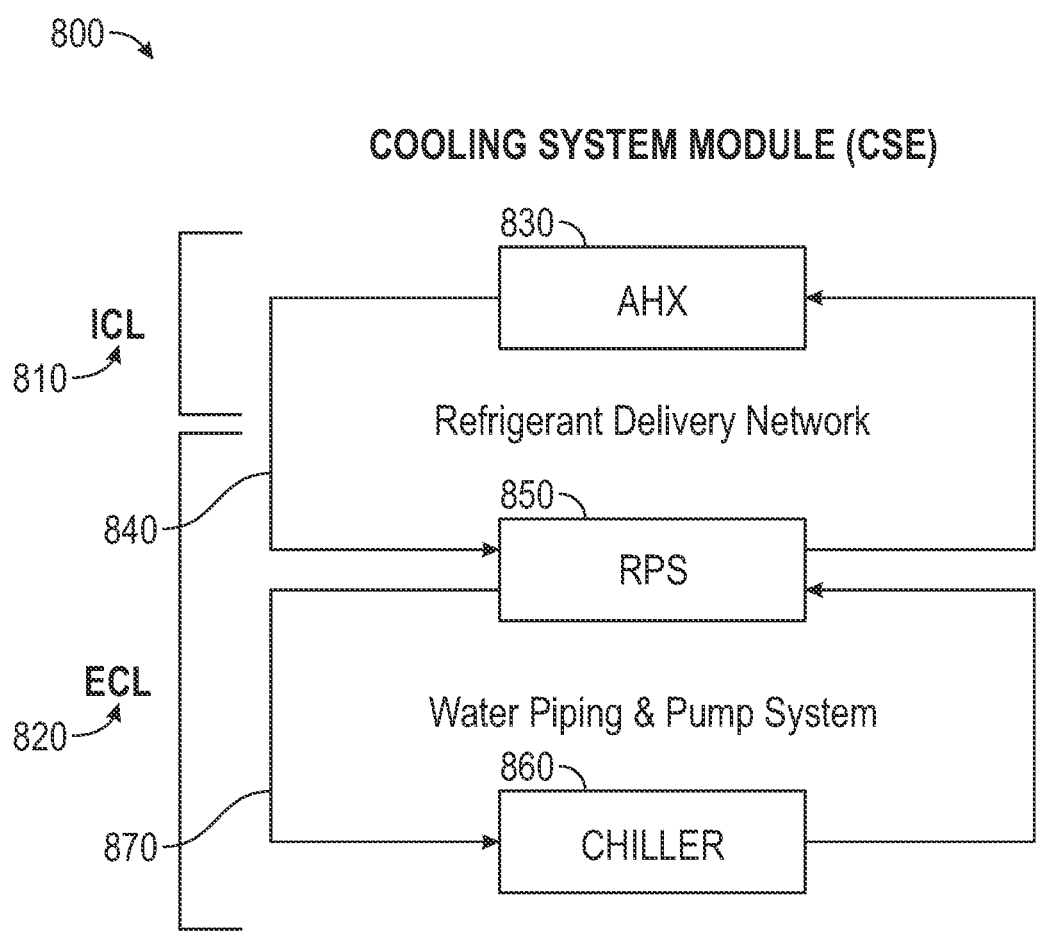
FIG. 17 is a diagram of a cooling system module according to one embodiment of the invention.

Turning now to FIG. 17, an alternate example cooling system module (CSM) 800 is shown. Cooling system module 800 comprises several pieces of cooling equipment that share the heat load of a common air space. Each cooling system module 800 is directly connected to one and only one power system module 210.

In the example shown, each cooling system module 800 is configured with two main loops 810, 820, as a hybrid system, interconnected with a heat exchanger 830. Internal cooling loop (ICL) 810 is located, for example, inside a data center processing space, where a waterless system must be used to prevent threat to electrical systems. Internal cooling loop 810 may use compressed liquid inert gas (refrigerant) for heat rejection. The compressed inert liquid reverts to a gas state at room temperature in the event of a leak. Internal cooling loop 810 may further comprise a refrigerant delivery network (RDN) 840, for example, available under the trade name Opticool, and an active heat exchanger (AHX) 830. Internal cooling loop 810 is interconnected to a refrigerant pump system (RPS) 850/heat exchanger 830 in an external cooling loop (ECL) 820.

External cooling loop (ECL) 820 may be housed outside the data center processing space, where the use of a water-based system does not impose a threat to critical electrical systems. External cooling loop 820 may use a water-based glycol unit for heat rejection. External cooling loop 820 for each cooling system module 800 is compartmentalized to chiller 860 where it vents to atmosphere. ECL 820 may further comprise a refrigerant pump system (RPS) 850, water piping and pump system (WPPS) 870, and chiller system 860. Refrigerant delivery network 840 pumps the compressed liquid inert gas, in a loop from the active heat exchanger 830 (where heat is removed from the load) in internal cooling loop 810 to the refrigerant pump system 850 in external cooling loop 820 where the heat is exchanged and pushed downstream in external cooling loop 820 to the chiller 860 and removed.

Each cooling system module 800 may comprise several stand-alone internal- and external cooling loop coupled loops 810, 820. Each cooling system module 800 is only fed by one power system module 210. In the example, data center system 900 shown in FIGS. 18-19, cooling system module 800 and power system modules 210 are coupled PSM-A:CSM-aa, PSM-B:CSM-bb, PSM-C:CSM-cc, and PSM-D:CSM-dd.

The load is near equally balanced between each cooling system module 800 as an operational requirement under normal operating conditions. Each cooling system module 800 maintains a maximum aggregate average below 75% of the rated load capacity for available utilization under normal load conditions. If one cooling system module 800 has a fault or failure or needs to be taken offline for maintenance (FFM), the net result will be to increase to a maximum aggregate average below 100% of the rated load capacity for available utilization under FFM load conditions across the remaining operational units.

Figure 18:
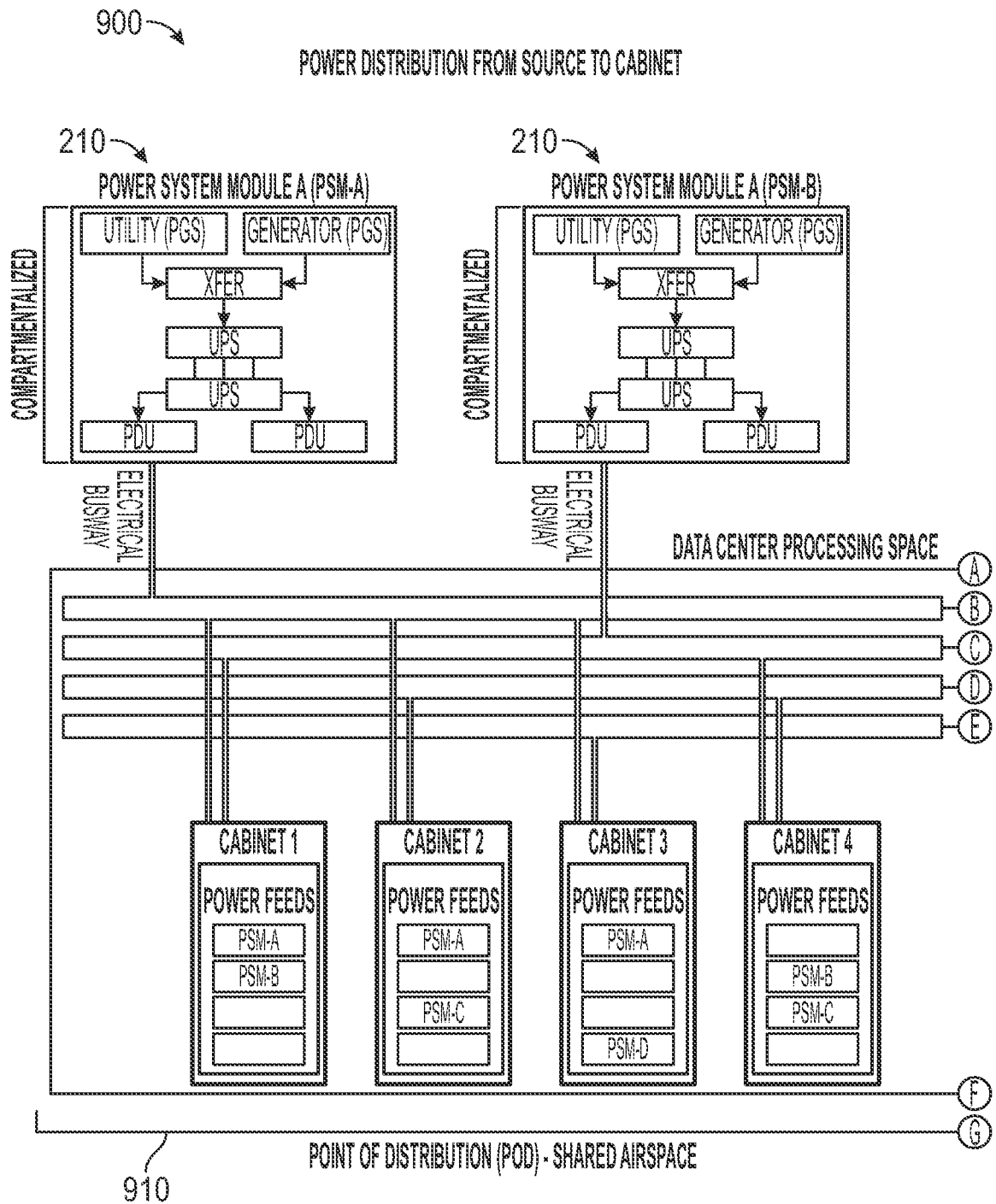
FIG. 18 is a diagram of an exemplary data center system power system according to one embodiment of the invention.
Figure 18:
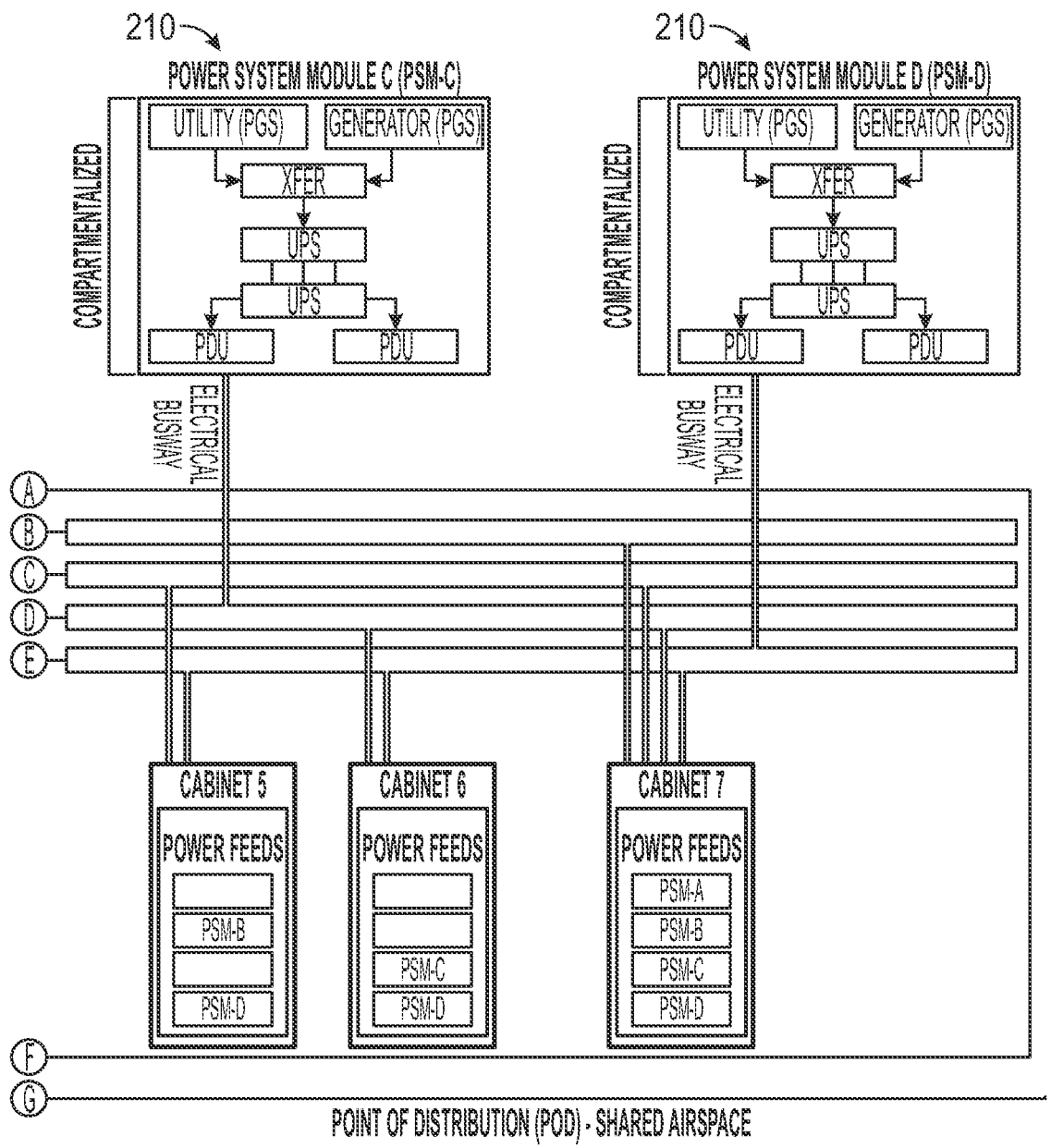
Figure 19:
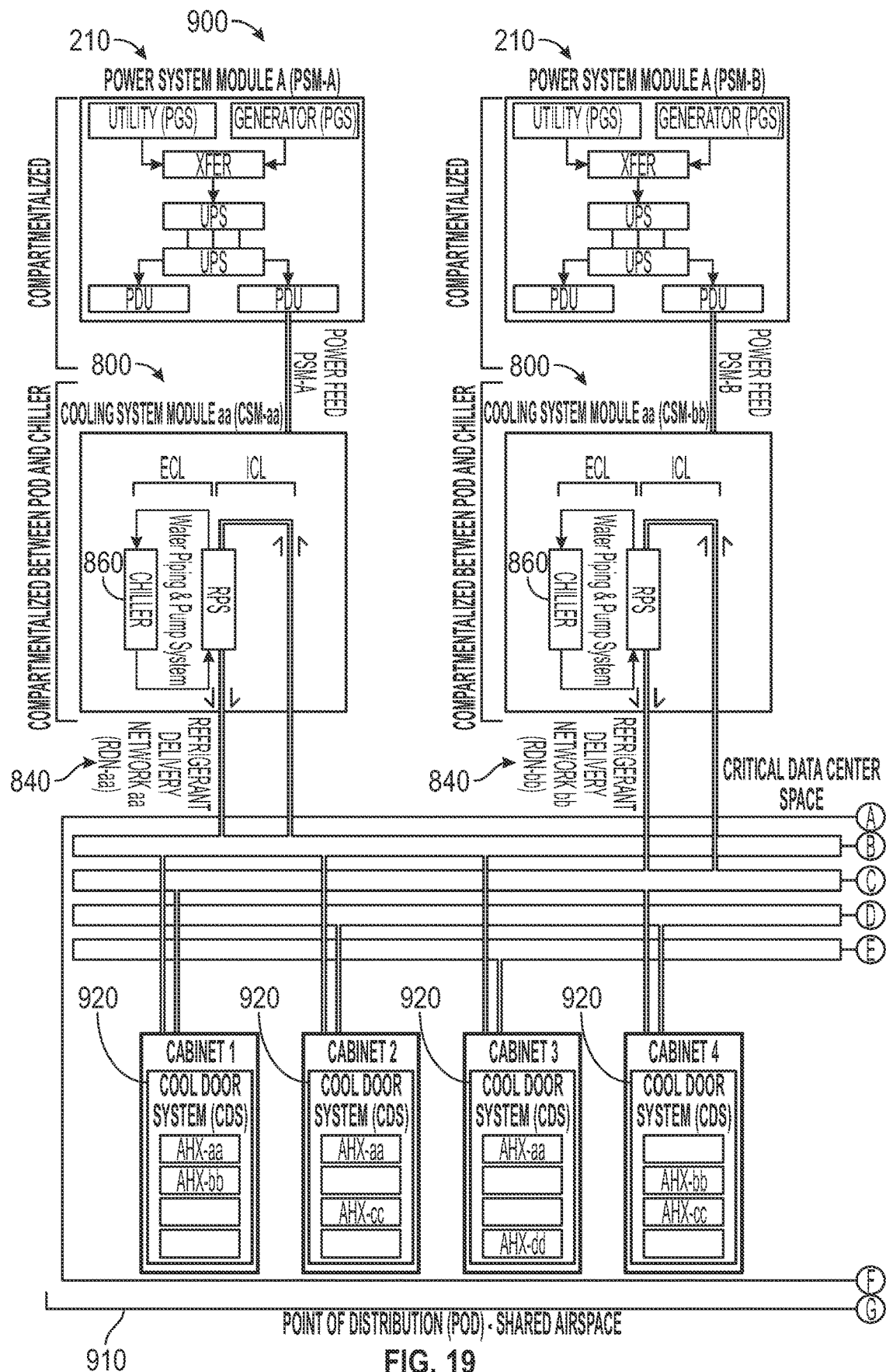
FIG. 19 is a diagram of an exemplary data center system cooling system according to one embodiment of the invention.
Figure 19:
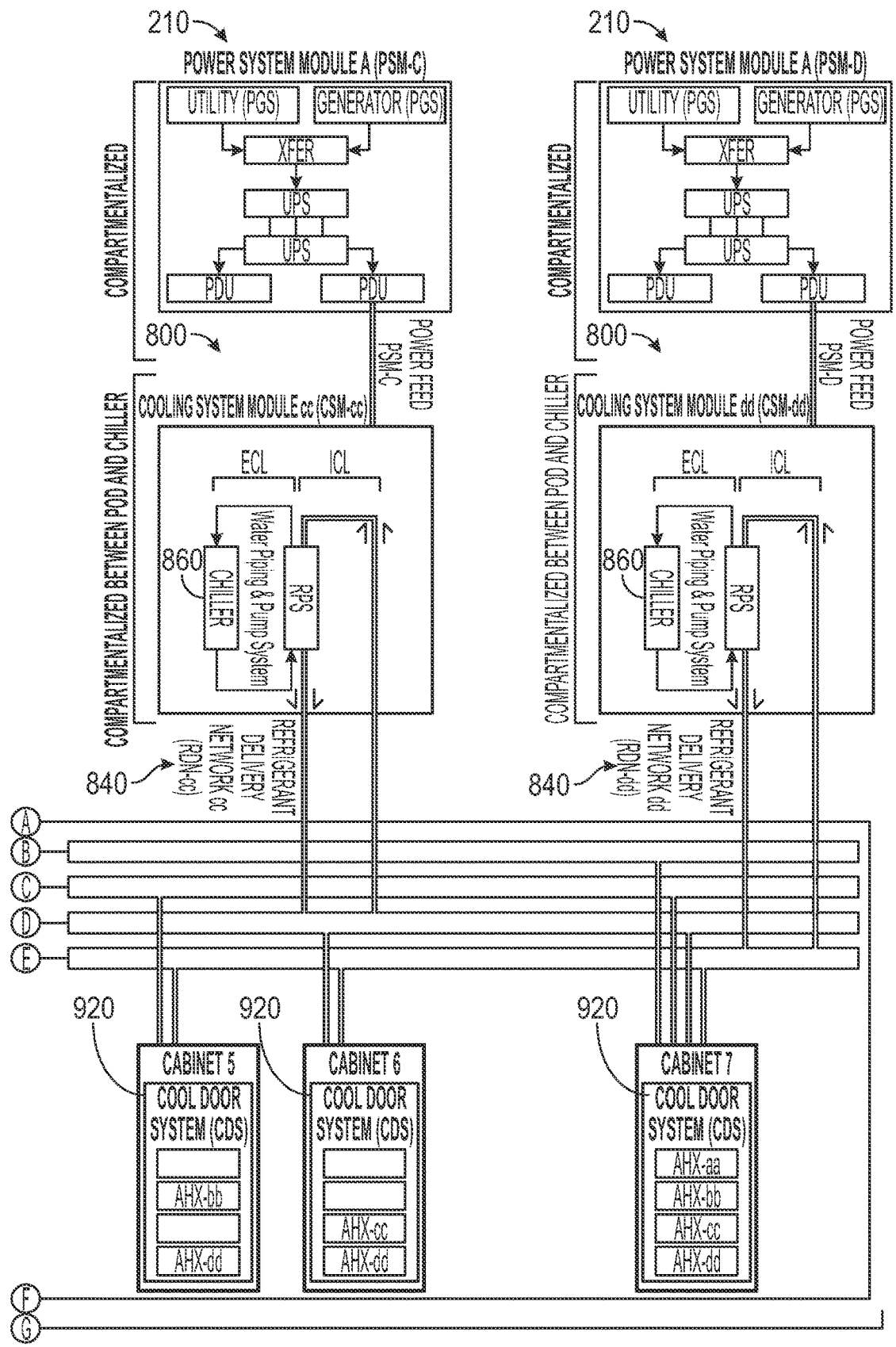

As further shown in the example, data center system 900 shown in FIGS. 18-19, each power system module 210/cooling system module 800 combination is distributed to near equally balance the load. Each cooling system module 800 is directly powered by only one power system module 210. Each cooling system module 800 is further partially compartmentalized from each other cooling system module 800 between the point of distribution (POD) 910 in the shared airspace (e.g., in a data processing space) and the chiller 860, which vents to atmosphere. Each cooling system module 800 supplies a number of active heat exchanger units along the refrigerant delivery network 840. In the example shown, an Opticool Cool Door System (CDS) 920 is provided that comprises at least two active heat exchanger units, each individually fed from different CSM 800/PSM 210 combinations. CDS 920 may comprise more active heat exchanger units if required. In this example, the CDS 920 is a cabinet door replacement that attaches the cooling to an IT server cabinet.

In FIGS. 18-19, each power system module 210 is configured to be in an active/active state to each other power system module 210. Likewise, each cooling system module 800 is configured to be in an active/active state to each other cooling system module 800.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:
1. A data center system comprising:
an electrical device comprising a load;
a cooling system comprising at least three independent, shared-airspace cooling system modules operated in parallel, wherein
each of the at least three independent, shared-airspace cooling system modules comprises an internal cooling loop and an external cooling loop connected to a heat exchanger, not shared by another cooling system module, wherein
the internal cooling loop is disposed in a data center processing space and comprises a refrigerant delivery network that uses compressed liquid inert gas for heat rejection, and is connected to a refrigerant pump system in the external cooling loop; and
the external coding loop is disposed outside the data center processing space, comprises a water-based glycol unit for heat rejection, the refrigerant pump system, a water piping and pump system (WPPS), and a chiller system;
a power system comprising at least three fully-compartmentalized power system modules operated in parallel to provide power to the load, wherein
each of the at least three fully-compartmentalized power modules comprises at least two power generation sources running in parallel in an active/passive state and at least one of the at least two power generation sources is a generator,
each power generation source is connected to a transfer switch operable to switch between power generation sources,
each transfer switch is connected downstream to an uninterruptable power supply, and
each uninterruptable power supply is connected downstream directly to a power distribution unit distributing power to the load;
a mechanical system controller;
a point of distribution disposed in the data center processing space;
wherein the load is spread substantially evenly through the cooling system and the power system, and in which a failure of any one of the cooling system modules or power system modules does not impact load;

wherein each of the at least three independent, shared-airspace cooling system module is coupled to one and only one of the at least three fully-compartmentalized power system modules in a 1:1 configuration; and wherein each power system module operates in an active/active state to each other power system module and each cooling system module operates in an active/active state to each other cooling system module.

2. A method of operating a data center system comprising:

providing an electrical device comprising a load;

providing a cooling system comprising at least three independent, shared-airspace cooling system modules, wherein each of the at least three independent, shared-airspace cooling modules comprises an internal cooling loop and an external cooling loop connected to a heat exchanger, not shared by another cooling system module, wherein the internal cooling loop is disposed in a data center processing space and comprises a refrigerant delivery network that uses compressed liquid inert gas for heat rejection, and is connected to a refrigerant pump system in the external cooling loop; and the external cooling loop is disposed outside the data center processing space and comprises a water-based glycol unit for heat rejection, the refrigerant pump system, a water piping and pump system (WPPS), and a chiller system;

operating the at least three independent, shared-airspace cooling system modules in parallel;

providing a power system comprising at least three fully-compartmentalized power system modules to provide power to the load, wherein each of the at least three fully-compartmentalized power modules comprises at least two power generation sources running in parallel in an active/passive state and at least one of the at least two power generation sources is a generator, each power generation source is connected to a transfer switch operable to switch between power generation sources, each transfer switch is connected downstream to an uninterruptable power supply, and each uninterruptable power supply is connected downstream directly to a power distribution unit distributing power to the load;

operating the at least three fully-compartmentalized power system modules in parallel;

pairing each of the at least three independent, shared-airspace cooling system modules to one and only one of the at least three fully-compartmentalized power system modules in a 1:1 configuration;

operating each of the at least three fully-compartmentalized power system modules in an active/active state to each other power system module;

operating each of the at least three independent, shared-airspace cooling system modules in an active/active state to each other cooling system module;

spreading the load substantially evenly through the cooling system and the power system;

maintaining a maximum aggregate average below 75% of rated load capacity for available utilization under normal load conditions; and in the event of a failure of any one of the cooling system modules or power system modules, increasing the maximum aggregate average below 100% of the rated load capacity for available utilization across remaining operational cooling system modules and power system modules.

3. A data center system comprising:

an electrical device comprising a load;

a cooling system comprising at least three independent, shared-airspace cooling system modules operated in parallel, wherein each of the at least three independent, shared-airspace cooling system module comprises a direct expansion cooling system not shared with another cooling system module;

a power system comprising at least three fully-compartmentalized power system modules operated in parallel to provide power to the load, wherein each of the at least three fully-compartmentalized power modules comprises at least two power generation sources running in parallel in an active/passive state and at least one of the at least two power generation sources is a generator, each power generation source is connected to a transfer switch operable to switch between power generation sources, each transfer switch is connected downstream to an uninterruptible power supply, and each uninterruptable power supply is connected downstream to a power distribution unit distributing power directly to the bad;

a mechanical system controller;

a point of distribution disposed in the data center processing space;

wherein the bad is spread substantially evenly through the cooling system and the power system, and in which a failure of any one of the cooling system modules or power system modules does not impact load;

wherein each of the at least three independent, shared-airspace cooling system modules is coupled to one and only one of the at least three fully-compartmentalized power system modules in a 1:1 configuration; and wherein each power system module operates in an active/active state to each other power system module and each cooling system module operates in an active/active state to each other cooling system module.

* * * * *